United States Patent
Schneider et al.

(10) Patent No.: US 7,583,713 B2
(45) Date of Patent: Sep. 1, 2009

(54) UNIPOLAR QUANTUM CASCADE LASER (75) Inventors: Harald Schneider, Reute (DE); Klaus Kohler, Freiburg (DE); Herrn Quankui Yang, Gundelfingen (DE)

(73) Assignee: Fraunhofer-Gesellschaft zur Förderung, Munich (DE)

( * ) Notice: Subject to any disclaimer, the term of this patent is extended or adjusted under 35 U.S.C. 154(b) by 198 days.

(21) Appl. No.: 10/488,859

(22) PCT Filed: Sep. 6, 2002

(86) PCT No.: PCT/EP02/10019

§ 371 (c)(1),
(2), (4) Date: Oct. 6, 2004

(87) PCT Pub. No.: WO03/023909

PCT Pub. Date: Mar. 20, 2003

(65) Prior Publication Data

US 2005/0036530 A1 Feb. 17, 2005

(30) Foreign Application Priority Data

Sep. 7, 2001 (DE) ................................. 101 43 956

(51) Int. Cl.
*H01S 5/00* (2006.01)
*H01S 3/082* (2006.01)

(52) U.S. Cl. ...................... 372/45.01; 372/97
(58) Field of Classification Search ............. 372/45.01, 372/45.012, 46.01, 97
See application file for complete search history.

(56) References Cited

U.S. PATENT DOCUMENTS 5,509,024 A  4/1996 Bour et al.
5,799,026 A  8/1998 Meyer et al.
6,154,475 A  11/2000 Soref et al.

(Continued)

FOREIGN PATENT DOCUMENTS

WO      WO 01/26192 A1   4/2001

OTHER PUBLICATIONS

S. R. Kurtz et al, "High Slope Efficiency, 'cascaded'"midiinfrared Lasers with Type I InAsSb Quantum Wells, appearing in Applied Physics Letters, vol. 72, N. 17, Apr. 27, 1998, pp. 2093-2095, © 1998 American Institute of Physics.

(Continued)

*Primary Examiner*—Minsun Harvey
*Assistant Examiner*—Marcia A. Golub
(74) *Attorney, Agent, or Firm*—Antonelli, Terry, Stout & Klaus, LLP.

(57) ABSTRACT

The invention relates to an unipolar quantum cascade laser comprising a plurality of adjacent semiconductor multilayer structures arranged in a periodic sequence through which an electron flow can be generated by providing at least two contact points, each of the multilayer structures having an optically active area comprising at least one quantum film structure in which there is at least one upper energy level and one lower energy level for the electrons, between which said levels light emitting electron transitions occur, as well as having a transition area comprising a plurality of semiconductor layers through which electrons from the lower energy level of said optically active area pass into the upper energy level of an optically active area of an adjacent semiconductor multilayer structure, which is directly adjacent to the transition area in the direction of electron transport, wherein the electron transitions and the electron transport occur solely in the conduction band of the semiconductor multilayer structures. The invention includes at least one blocking layer, which has an uppermost conduction band edge potential that is higher than the uppermost band edge potential of all the other semiconductor layers contained inside the semiconductor multilayer structure, is provided in the semiconductor multilayer structure.

17 Claims, 3 Drawing Sheets

U.S. PATENT DOCUMENTS

| | | | |
|---|---|---|---|
| 6,278,134 B1 | 8/2001 | Capasso et al. | |
| 6,404,791 B1 * | 6/2002 | Yang | 372/45.01 |
| 6,891,869 B2 * | 5/2005 | Augusto | 372/43.01 |
| 6,922,427 B2 * | 7/2005 | Faist et al. | 372/45.01 |
| 2002/0131463 A1 * | 9/2002 | Bruno et al. | 372/45 |

OTHER PUBLICATIONS

A. A. Allerman et al, "InAsSb-based Mid-infrared Lasers (3.8-3.9 μm) and light-emitting diodes with AlAsSb Claddings and Semimetal Electron Injection, Grown by Metalorganic Chemical Vapor Deposition", appearing in Appl. Phys. Lett., vol. 69, No. 4, Jul. 22, 1998, pp. 465-467, © 1996 American Institute of Physics.

T. Takiguchi et al, "Improvement of Crystal Quality and Laser Characteristics by Zero Net Strain Structure", appearing in Journal of Crystal Growth 145 (1994), pp. 892-897, © 1994 Elsevier Science B.V.

Carlo Sirtori, et al, "Resonant Tunneling in Quantum Cascade Lasers", appearing in IEEE Journal of Quantum Electronics, vol. 34, No. 9, Sep. 1998, pp. 1722-1729, © 1998 IEEE.

Yang, Q.K. et al, "Improvement of Lambda 5 Mum Quantum Cascade Lasers by Blocking Barriers in the Active Regions", Applied Physics Letters, American Institute of Physics, New York, U.S., vol. 80, No. 12, Mar. 25, 2003, pp. 2048-2050, XP001108479 ISSN: 0003-6951.

* cited by examiner (State of the Art) Fig. 1

Fig. 5

UNIPOLAR QUANTUM CASCADE LASER

FIELD OF THE INVENTION

The present invention relates to a unipolar quantum cascade laser comprising a plurality of adjacent semiconductor multilayer structures arranged in a periodic sequence through which an electron flow can be generated by providing at least two contact points, each of the multilayer structures having an optically active area comprising at least one quantum film structure, in which there is at least one upper energy level and one lower energy level for electrons, between which levels light emitting electron transitions occur, as well as having a transition area comprising a plurality of semiconductor layers, through which electrons from the lower energy level of the optically active area pass into the upper energy level of an optically active area of an adjacent semiconductor multilayer structure, which is directly adjacent to the transition area in the direction of electron transport, wherein the electron transitions and the electron transport occur solely in the conduction band of the semiconductor multilayer structures.

DESCRIPTION OF THE PRIOR ART

Quantum cascade lasers of the aforementioned generic group are unipolar laser light sources produced from semiconductor materials, which emit light of the middle to the far end of the infrared spectral range, i.e. 3-15 μm. In particular, quantum cascade lasers in the wave range between 4-5 μm are presently the most advanced sources of infrared light, which also possess technically interesting efficiency at relatively high temperatures.

Figures 1, 2:
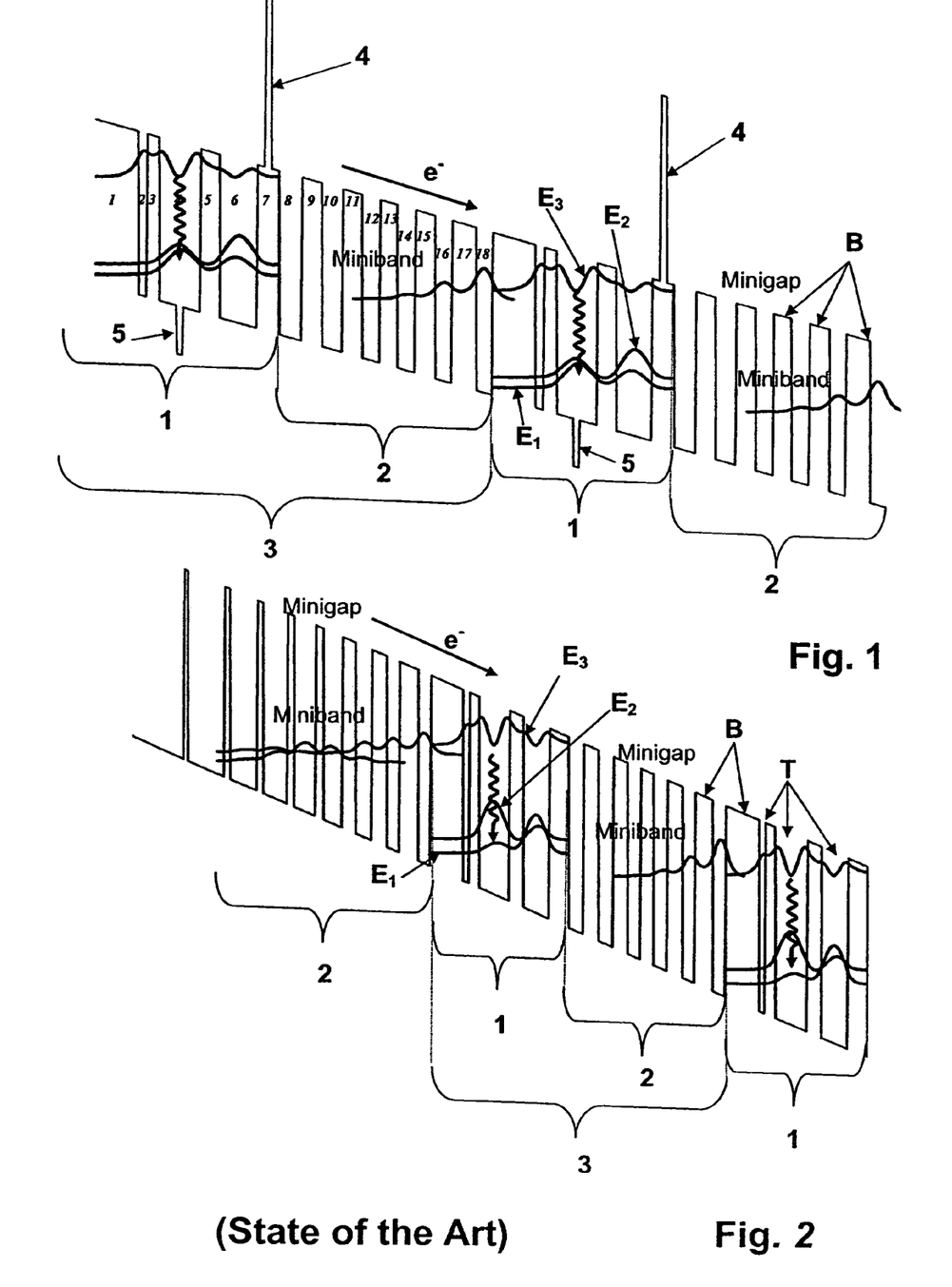
FIG. 1 is a band pattern of a quantum cascade laser designed according to the invention having a blocking layer.
FIG. 2 is a band pattern of a prior-art quantum cascade laser.

Quantum cascade lasers have been known since 1995 and have undergone continuous scientific development since this time, the ultimate aim being to increase their efficiency. The present state of development of such type lasers can be found in the current patent literature, in particular, in the U.S. Pat. Nos. 5,457,709, 5,509,025, 5,745,516 as well as U.S. Pat. No. 5,936,989. The band model of a prior-art quantum cascade laser described in the aforementioned patent literature is shown in FIG. 2. Quantum cascade lasers are usually composed of a plurality of stacked-like joined semiconductor multilayer structures 3, which can, for their part, be subdivided into an optically active area 1 and a transition area 2. Each single semiconductor multilayer structure 3 is composed of an alternating sequence of single semiconductor layers, each of which stems from one semiconductor material system which provides a layer combination of two different semiconductor materials, notably so-called pot (T) materials and so-called barrier (B) materials, whose characteristic band courses can be seen in the meandering-shaped behavior of the representation shown in FIG. 2. An essential feature of the characteristic band pattern of a unipolar quantum cascade laser, as shown in FIG. 2, is that solely electrons are involved in the charge carrier transport, which occurs inside the optically active areas as well as inside their adjacent transition areas. In this manner, inside the optically active areas solely electron-electron transitions occur between the individual subbands, which belong to the same electronic band, notably the conduction band. The unipolar quantum cascade lasers differ, therefore, fundamentally from interband cascade lasers, respectively cascaded bipolar interband lasers, in which electrons and holes are involved in the charge carrier transport.

Presently, GaInAs/AlInAs or InGaAs/AlAsSb, each of which is deposited onto an InP substrate lattice in such a manner that it is adapted to the lattice, that is without any internal lattice tension. GaAS/AlGaAs on a GaAs substrate or InAs/AlSb placed on a binary GaSb substrate or InAs substrate are also regarded as particularly suited as semiconductor material systems for unipolar quantum cascade lasers. Naturally, there are also other semiconductor material systems that can be used to construct a quantum cascade laser, such as for example, GaAs/AlGaSb. However, further relationships are described in more detail using AlInAs/GaInAs mentioned in the preceding without the intention of limitation to a concrete semiconductor material system.

The barrier layers B shown in FIG. 2 are all composed of AlInAs, and the pot layer T directly following it is composed of GaInAs. Addition of certain doping substances to the single semiconductor material layers ensures in a prior-art manner that the charge carriers are present in a suited concentration in the multilayer structure. The layer design of the semiconductor multilayer structure 3, which is completely composed of an alternating sequence of the semiconductor layers B and T mentioned in the preceding, with the optical area 1 and the transition area 2, which for their part have different allowed energy levels for the charge carriers located respectively in the corresponding area, is achieved in an as such prior-art manner by means of selecting a suited number of barrier layers and pot layers with suited thicknesses. The optical area 1 in a semiconductor multilayer structure 3 is distinguished by a specific upper energy level $E_3$ being provided, which is the allowed energy level for electrons as charge carriers. In addition, two further lower energy levels for electrons $E_2$ and $E_1$ are provided inside this optical area. In FIG. 2, the aforementioned energy levels inside the optical area 1 are drawn as bold continuous lines, which correspond to the course of a numerically determined square wave function (Schrödinger equation). If the electrons are located in the energy level $E_3$, an allowed electron transition occurs between the energy levels $E_3$ and $E_2$, in which light emits. In order to ensure that the energy level $E_2$ is not overcrowded and occupied, an additional energy level $E_1$ serves to continually empty the energy level $E_2$ due to a very short relaxation period between $E_2$ and $E_1$.

In contrast to this, the transition area 2 is constructed as a superlattice acting as a Bragg reflector and is provided with a miniband area, which at least partly overlaps with the energy levels $E_2$ and $E_1$ of the directly adjacent optical area.

If, as shown in FIG. 2, an electric bias voltage is applied laterally to the plurality of stack-like arranged semiconductor multilayer structures 3 in such a manner that the band model assumes the diagonally declining band course in FIG. 2, an electron flow is generated through the plurality of directly adjacent semiconductor structures 3 in the electron transport direction (see detail) leading to light-emitting electron transitions inside the single optical areas 1. Characteristic of quantum cascade lasers is the name-bestowing cascade behavior of the single electrons on their way through the adjacent semiconductor structures 3. Following light-emitting energy transmission and relaxation into the energy level $E_1$ inside an optical area 1, the electron passes from this lower energy level $E_1$ into the miniband of the adjacent transition area 2, from where it is injected into a further upper energy level $E_1$ of a further adjacent, in the electron transport direction, optical area 1. Another light-emitting transition, which recurs depending on the number of stack-like combined semiconductor multilayer structures 3 occurs here.

From a purely theoretical viewpoint, it may be assumed that each electron injected into N adjacent semiconductor multilayer structures arranged in a periodic sequence generates correspondingly N photons so that the theoretically optimum external quantum efficiency is N×100%, provided that no loss mechanisms act on the electron on its way through the N semiconductor multilayer structures. Experiments with quantum cascade lasers which have more than N=25 adjacent semiconductor multilayer structures demonstrated, despite practically optimum design of the quantum cascade lasers, an external quantum efficiency of only 500%, which after all is 80% below the theoretically achievable external quantum efficiency.

The occurring losses are connected, on the one hand, with the fact that the duration of a light-emitting transition is substantially longer than that of the not radiating energy relaxation, which mainly occurs in the emission of photons. This fact leads to a high threshold current for laser activity which is characteristic of quantum cascade lasers. Above the laser threshold, the duration of the light-emitting transition, which is stimulated, is sufficiently short (shorter than the duration of the not radiating relaxation) so that efficient light emission occurs.

On the other hand, in the case of high current densities above the laser threshold, particularly tunneling processes play a decisive role. The high-energy electrons inside the upper energy level $E_3$ pass due to these tunneling processes from the optically active area into the energy continuum and thus vanish unused in the quantum cascade laser structures. This problem occurs especially if high optical energies or high operational temperatures are supposed to be achieved, which requires great current densities and power losses.

To remedy these loss mechanisms, the U.S. patents cited in the preceding describe measures with which the corresponding tunneling processes can be counteracted. For this reason, the semiconductor layer design inside the transition area 2 is selected in such a manner that no allowed energy states are present near the electron band edge energy $E_3$ in the region of the transition area, but rather there is a minigap. This prevents electrons from passing from the optical region inside the energy level $E_3$ into the directly adjacent transition area so that the transition area acts on these high-energy electrons as a Bragg reflector, whereby the electrons inside the optical area are actually enclosed in the upper energy level $E_3$. Despite these efforts, the aforementioned measures were also unable to achieve better efficiency than described in the preceding. Therefore, there are grounds to assume that the measures hitherto undertaken to reduce loss mechanisms, to which the charge carrier, in particular, electrons are subject on their way through the periodic sequence of joined semiconductor multilayer structures, are inadequate.

U.S. Pat. No. 6,154,475 describes a unipolar quantum cascade laser in which holes emit light via intersubband transitions. This printed publication is, thus, an example for a quantum cascade laser that occurs solely on a hole-charge-carrier transport mechanism.

SUMMARY OF THE INVENTION

The present invention improves a unipolar quantum cascade laser of the aforedescribed generic group so that (despite hitherto prior-art measures to reduce the electron losses due to the tunneling processes, by which electrons pass into the energy continuum), more efficient, alternative, preventive measures to further decisively reduce these very loss mechanisms are undertaken. In particular, a quantum cascade laser is provided whose operation requires less threshold current density to trigger and sustain the laser process and which, moreover, possesses greater external efficiency and higher laser output.

The present invention further improves a unipolar quantum cascade laser comprising a plurality of adjacent semiconductor multilayer structures arranged in a periodic sequence through which an electron flow can be generated by providing at least two contact points, each of the multilayer structures having an optically active area comprising at least one quantum film structure in which there is at least one upper energy level and one lower energy level for electrons, between which levels of light emitting electron transitions occur, as well as having a transition area comprising a plurality of semiconductor layers through which electrons from the lower energy level of the optically active area pass into the upper energy level of an optically active area of an adjacent semiconductor multilayer structure, which is directly adjacent to the transition area in the direction of electron transport, wherein the electron transitions and the electron transport occur solely in the conduction band of the semiconductor multilayer structures in such a manner that at least one blocking layer, which has an upper conduction band edge potential that is higher than the uppermost band edge potential of all the other semiconductor layers contained inside the semiconductor multilayer structure, is provided in the semiconductor multilayer structure.

In contrast to previous practice of corresponding designing of the transition area as a superlattice in order to produce a Bragg reflector, the new approach of the invention is based on providing at least one additional thin layer made of a semiconductor material which differs from the materials of the respective semiconductor material system of which the quantum laser cascade is composed, and moveover on this layer at least one additional thin layer possesses a higher upper band edge energy so that the additional layer acts as a blocking layer in the electron transport direction for electrons located in the upper energy level $E_3$.

In a preferred arrangement, the blocking layer is disposed inside the optically active area in the electron transport direction directly adjacent to the transition area so that electrons in the upper energy level $E_3$ are almost completely prevented, due to the increased band edge energy of the blocking layer, from escaping into the energy continuum. On the other hand, suited selection of materials and suited layer design of the additional blocking layer provided according to the invention in the semiconductor multilayer structure permits setting the tunneling probability of the electrons located in the lower energy levels inside the optically active area in such a manner, preferably to select distinctly less than 1, that the electrons located, preferably, on the lowest energy level $E_1$ can easily tunnel through the blocking layer in order to be able to pass into the allowed energy states, provided by the miniband, of the provided adjacent transition area in the electron transport direction. It is to be noted that in order to make the unipolar character of the quantum cascade laser distinct, all the minibands of the optically active areas separated by the blocking layers belong to one and the same electronic band.

An especially preferred semiconductor material for realization of such a blocking layer for semiconductor material systems of a InGaAs/AlAs layer combination or a InGaAs/AlAsSb layer combination is AlAs having a layer thickness of 1 nm or less as a sort of A1As intermediate layer integrated at a suited location inside the semiconductor material system.

Preferably, the blocking layer designed according to the invention, for example in the preceding form as an AlAs layer, is integrated in the last semiconductor layer, in the electron transport direction, inside the optically active area directly adjacent to the first semiconductor layer inside the transition area. If the respective last semiconductor layer inside the optically active area is composed, for example, of a 3 nanometer thick AlInAs layer, which for its part acts as a barrier layer, this layer is replaced by the following sandwich structure having the succeeding single layer thicknesses: AlInAs (0.9 nm), AlAs (0.7 nm), AlInAs (0.9 nm).

The selection of the thicknesses of the preceding single layers joined in a sandwich structure occurs under the condition that the tunneling probability of the electrons located on the lower energy level $E_1$ inside the optically active area does not substantially change so that the overall thickness of the sandwich layer is usually dimensioned smaller than the original AlInAs layer. On the other hand, provision of a sandwich layer configured in such a manner, provided with a blocking layer, suffices to prevent electrons in the upper energy level $E_3$ from passing the blocking layer, as the tunneling probability present in high-energy electrons must be seen as being in competition with the desired radiating transition of the high-energy electrons in the upper energy level $E_3$ into the lower energy level $E_2$, which occurs under stimulated light emission.

In view of this physically competitive situation between the theoretical tunneling probability and the energy transition between the subbands $E_3$ and $E_2$, the blocking layer acts as an effective measure against loss-related escaping of electrons into the energy continuum. In this manner, the electrons are preserved for the desired radiating process, which leads to improved properties with regard to the laser threshold, maximum working temperature and maximum power output compared to purely a Bragg reflector.

Experiments have confirmed that a conventional AlInAs barrier layer without provision of an additional blocking layer can reduce the occurrence of tunneling incidents of electrons in the upper energy level $E_3$ by a factor of 4 compared to provision of a blocking layer. In both aforementioned cases, the transition area is designed as a Bragg reflector.

In addition to providing only a single blocking layer, preferably in the immediate boundary region between the optical area and the transition area inside of the semiconductor multilayer structure, naturally two or more blocking layers can also be provided at suited locations inside the semiconductor multilayer structure with the aim of preventing electrons from escaping from the upper energy level into the energy continuum. Corresponding preferred embodiments are described in detail further on with reference to the corresponding figures.

Another particular aspect in providing one or a multiplicity of blocking layers composed of AlAs is their different lattice structure compared to the conventional semiconductor materials used for quantum cascade lasers, such as for example GaInAs/AlInAs, InGaAs/AlAsSb, which are usually lattice-adapted on an InP base substrate, or InAs/AlSb, which is lattice-adapted on a binary GaSb or binary InAs base substrate.

By providing, for example, an AlAs layer inside the respective, prior-art semiconductor layer combinations, an intrinsic lattice tension inevitably occurs due to the different lattice structures, thereby permitting integration of only a limited number of blocking layers inside the respective semiconductor multilayer structures. Moreover, the thicknesses of the AlAs layers acting as blocking layers can only be varied to a limited degree without damaging the morphology of the semiconductor material system. To resolve, and, to eliminate this problem, InAs is lattice-misadapted to the corresponding base substrates, and, to semiconductor material systems in precisely a reverse manner to the aforementioned AlAs-induced lattice tension so that providing one or a corresponding multiplicity of InAs layers just compensates for the lattice tension caused by the AlAs layer respectively layers.

Location, thickness and number of the InAs layers to be provided inside the semiconductors multilayer structures should be selected according to the condition of as far as possible complete elimination of lattice tension in these existent blocking layers. Corresponding preferred embodiments in which more than one AlAs layer and at the same time an InAs layer are provided as well are described in detail hereafter.

The preceding and following preferred embodiments relate to semiconductor material systems designed for charge carrier transport of electrons. Fundamentally, the invention's measures of the selective provision of at least one blocking layer to prevent charge carrier losses can be applied even to semiconductor material systems, in which holes contribute to the overall charge carrier transport. These are so-called solely unipolar p-conducting quantum cascade laser structures, for example, based on a Si/SiGe material system.

BRIEF DESCRIPTION OF THE DRAWINGS

The present invention is made more apparent in the following, by way of example without the intention of limiting the spirit or scope of the overall inventive idea, using preferred embodiments with reference to the drawings. Shown is in.

DESCRIPTION OF THE PREFERRED EMBODIMENTS

FIG. 1 shows a band pattern of a quantum cascade laser designed according to the present invention with the corresponding reference numbers using the same reference numbers as introduced in FIG. 2.

A key element of the invention is that the last layer, always in the electron transport direction (see arrow above band pattern) inside the respective optically active area 1 adjacent to the transition area 2, is provided with a blocking layer 4, whose upper band energy is distinctly higher than the upper band energies of all the other barrier layers B. Due to the local excessive increase in potential generated by the blocking layer 4, electrons located on the upper energy level $E_3$ inside the optically active area 1 do not pass through this layer into the energy continuum. But rather the electrons relax dispatching a photon into the energy state $E_2$ from which they finally pass into the lowermost energy level $E_1$. It must be pointed out here once more that the energy levels $E_1, E_2, E_3$ lie inside the conduction band and taken alone represent subbands. The transition area 2 adjacent in the electron transport direction to the optically active area has a superlattice and acts as a Bragg reflector due to the minigap present in the energy level $E_3$ for these high-energy electrons. As is shown further on in FIG. 3, electrons located on the energy level $E_1$ inside the optically active area 1 pass practically unaffected into the miniband located in the transition area 2 despite the blocking layer 4.

As the blocking layer 4 is composed of different material than the semiconductor layer combinations, for example GaInAs/AlInAs layer combination or InGaAs/AlAsSb layer combination employed for the semiconductor multilayer structure 3, as already explained in the preceding, intrinsic lattice tension occurs inside the semiconductor multilayer structure, which must be compensated with an additional semiconductor layer. Thus selective provision of an InAs layer inside the semiconductor multilayer structure is almost able to completely compensate the lattice tension induced by the AlAs layer.

Therefore, in the preferred embodiments of FIG. 1, an additional InAs layer 5, which is able to selectively compensate the lattice tension induced by the blocking layer, is provided in each optical area 1. In this manner, further degrees of freedom are created in selecting the layer thickness of the blocking layer as well as in the possible number of separate blocking layers to be integrated in the semiconductor layer system. Fundamentally, there is no limit to the arrangement and the number of blocking layers to be utilized as long as they serve the purpose of reducing the loss mechanism connected with high-energy electrons entering the energy continuum.

With reference to the semiconductor structure 3 shown in FIG. 1 composed of the optical area 1 and the transition area 2 and whose single semiconductor layers are numbered consecutively 1-18 in italics, a specific preferred embodiment of a quantum cascade laser constructed on the basis of an AlInAs/GaInAs semiconductor system is described in detail. The semiconductor material layers arranged in a periodic sequence are composed, in particular, of the following semiconductor material composition: $Al_{0.48}In_{0.52}As/Ga_{0.47}In_{0.53}As$. The odd numbered semiconductor layers 1,3, 5, . . . ,17 are to AlInAs layers, whereas the even numbered semiconductor layers 2,4,6, . . . ,18 are GaInAs layers. The semiconductor layer 4 is composed of a sandwich structure composed of a GaInAs/InAs/GaInAs layer combination. The semiconductor layer 7, on the other hand, has a layer structure of the following manner: AlInAs/AlAs/AlInAs. Furthermore, the semiconductor layers 13, 14 and 15 are additionally doped with silicon in a concentration of $2\times10^{17}/cm^3$. The following table shows the individual layer thicknesses of the semiconductor layers 1-18.

With regard to layer 7, in which the blocking layer 4 is integrated, it should be noted that the layer thickness of the AlAs layer should be selected in such a manner that the tunneling probability of electrons on the energy level $E_1$ remains essentially uninfluenced. In order to compensate for the lattice tension induced by the AlAs layer, an InAs layer 5 of the same thickness (0.7 nm) is placed in the semiconductor layer 4.

| No. | | | | | | | |
|---|---|---|---|---|---|---|---|
| 1 | 2 | 3 | 4 | 5 | 6 | 7 | 8 |
| Thickness (nm) | | | | | | | |
| 5.0 | 1.0 | 1.5 | 2.0/0.7(InAs)/2.0 | 2.2 | 4.1 | 0.9/0.7(A/As/0.9 | 2.5 |

| No. | | | | | | | | | |
|---|---|---|---|---|---|---|---|---|---|
| 9 | 10 | 11 | 12 | 13 | 14 | 15 | 16 | 17 | 18 |
| Thickness (nm) | | | | | | | | | |
| 2.3 | 2.3 | 2.2 | 2.0 | 2.0 | 2.0 | 2.3 | 1.9 | 2.8 | 1.9 |

Figure 3:
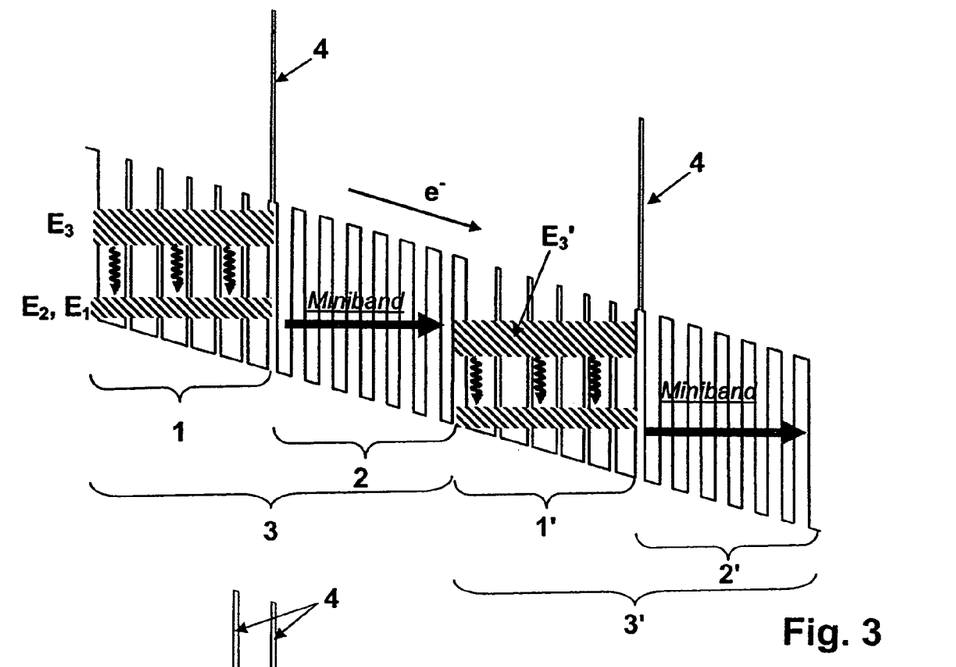
FIG. 3 is a band pattern of a quantum cascade laser designed according to the invention having a blocking layer in which the optical transition occurs between miniband states.

FIG. 3 depicts a detail of a band pattern of a quantum cascade laser showing two adjacent semiconductor multilayer structures 3,3'. According to the oblique course of the band, the electron transport direction, according to the arrow, is apparently from left to right. Electrons which relax inside the optical area 1 from an upper miniband, which corresponds to the energy level $E_3$, under light emission into a lower miniband, which corresponds to the lower energy levels $E_2$, $E_1$ pass, despite the presence of the blocking layer 4, into the miniband of the adjacent transition area 2, through which they pass in electron transport direction into the optically active area 1' of the adjacent semiconductor multilayer structure 3'. Here the electrons are injected into the upper miniband, corresponding to the energy level $E_3$, from which they can relax into the corresponding lower energy levels under light emission. The superlattice provided inside the transition area 2, which has the Bragg reflector effect on the high-energy electrons, at the same time also ensures that the electrons located inside the miniband cannot pass into the free energy region so that they can be conveyed completely into the provided adjacent, in the electron flow direction, optical area. The minibands inside the optical area in this preferred embodiment, between which energy transitions occur under light emission, stem from a superlattice also located inside the optical area. Quantum cascade lasers designed in this manner can also be optimized in accordance with the invention by providing suited blocking layers in the described manner.

Figure 4:
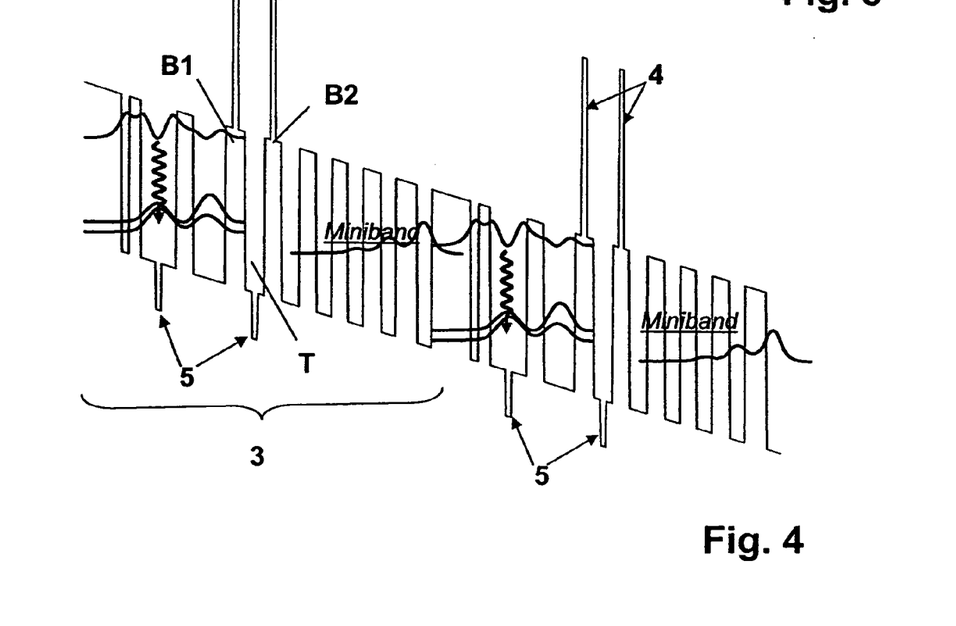
FIG. 4 is a band pattern of a quantum cascade laser designed according to the invention having two blocking layers.

In addition to the provision of only a single blocking layer 4 inside a semiconductor multilayer structure 3, FIG. 4 shows a preferred embodiment in which two blocking layers 4 are disposed inside a semiconductor multilayer structure 3. The two blocking layers 4 are located in two adjacent barrier layers B1 and B2 respectively, B1 being the boundary layer of the optical area and the barrier layer B2 being the adjacent boundary layer already inside the transition area. A lattice-tension-compensation layer 5 is provided in the pot layer T, which lies between the two barrier layers B1 and B2, and an additional lattice-tension-compensation layer 5 is provided in the middle of the optical area 1. It is, of course, also possible to provide more than two blocking layers, but in the same manner a corresponding lattice-tension-compensation layer 5, preferably InAs, has to be placed at a corresponding location inside the semiconductor multilayer structure.

Finally, Wanke et al. (Appl. Phys. Lett. 78, 3950(2001) describe a further variant of a quantum cascade laser in which the structure of the injector zone and the optically active area are combined as an active zone in a single superlattice structure thereby resulting in periodic recurrence of this lattice structure as the laser core. Quantum cascade lasers designed in this manner can also be optimized with the invention by providing suited blocking layers in the described manner. The (in case of this publication 3.7 nm thick) AlInAs barrier which separates the single periods would have to be replaced by such a type blocking layer.

The preferred embodiments described in the preceding, as mentioned in the introduction, are described using the example of a GaInAs/AlInAs semiconductor material system, but their construction is also realizable using alternative semiconductor material systems such as InGaAs/AlAsSb, GaAs/AlGaAs or InAs/AlSb layer combinations. In the corresponding layer combinations, the blocking layer is integrated at a suited location in the barrier material, for example as a sandwich structure, in the following manner: AlInAs/AlAs/AlInAs, AlGaAs/AlAs/AlGaAs or AlAsSb/AlAs/AlAsSb. In the case of GaAs/AlGaAs, the AlAs layers do not lead to any significant additional lattice tension thus obviating compensation layers.

In addition to the preferred positioning of the blocking layer directly at the boundary of the optical area to the transition area, it has also proven to be advantageous to place the blocking layer in all the barrier layers inside the semiconductor multilayer structure. However, the consequence is that, in order to compensate the induced lattice tension, a corresponding lattice-tension compensation layer, preferably an InAs layer, has also to be placed in all the pot layers inside the semiconductor multilayer structure. With this measure, the tendency of high-energy electrons to pass into the energy continuum is reduced to a minimum.

Figure 5:
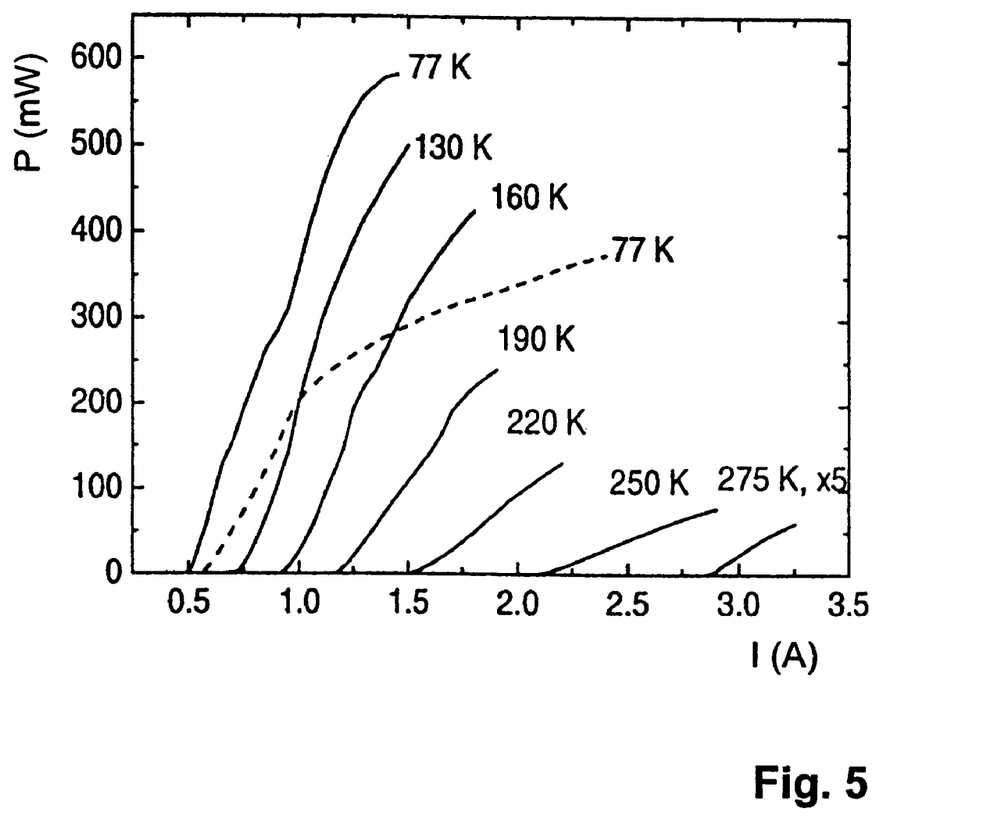
FIG. 5 is a current/power diagram (I/P) of a quantum cascade laser according to the invention.

In order to conduct representative comparative measurements between a quantum cascade laser designed according to the invention and a conventional quantum cascade layer of the same type of construction, two otherwise identical quantum cascade lasers each with 25 semiconductor multilayer structures arranged in a periodic sequence on the basis of a GaInAs/AlInAs semiconductor material system were grown on an InP base substrate. The quantum cascade laser designed according to the invention, contrary to its conventional counterpart, has both a blocking layer inside the optical area as well as a layer compensating the lattice tension induced by the blocking layer. After processing and contacting of both lasers with corresponding contact electrodes, electrical current, which has current pulses with a pulse period of 500 nsec with a repetition rate of 10 kHz, is applied to both lasers. The light emitted by the quantum cascade laser is detected with a correspondingly calibrated InSb detector, which is spectrally analyzed with the aid of a Fourier spectrometer. FIG. 5 shows the measured values of the conducted comparative measurement in a current/power diagram (I/P diagram). The current flowing through the respective quantum cascade laser is given in amperes along the abscissa. The light power output detected by the light detector is given in mW along the ordinate. The function courses drawn in the diagram with a continuous line correspond to the measurement curves of measured light power output of the quantum cascade laser designed according to the invention at different temperatures. Thus it turns out that the quantum cascade laser designed according to the invention is able to generate significant light power output even at operational temperatures of 275° Kelvin. However, if the quantum cascade laser designed according to the invention is compared with a conventionally designed quantum cascade laser without a blocking layer (see the broken-line measurement curve in the diagram according to FIG. 5) at a temperature of 77° Kelvin, it turns out that the conventional quantum cascade laser has a slope ("slope efficiency") of 610 mW/A, which corresponds to an extreme quantum efficiency of 488%. This measured value corresponds approximately to a published quantum efficiency of 478% for a quantum cascade laser with a 25-fold stack arrangement emitting at 5 μm. Compared to this, the quantum cascade designed according to the invention with blocking layers has a slope of 866 mW/A, which corresponds to an external quantum efficiency of 693%. This external quantum efficiency is, however, 40% higher than what a conventional quantum cascade laser can achieve.

Another particularity of the aforedescribed measurement comparison concerns the wavelengths of the emitted light. It has turned out that by providing a blocking layer and an additional lattice-tension compensation layer, the quantum cascade laser designed according to the invention emits a shorter wavelength (4.94 μm) than the quantum cascade laser without a blocking layer (5.08 μm). The difference between the two emission wavelengths is due to the deeper pot structure, as a result of the provision of an InAs layer, thus the lattice-tension-compensation layer, which increases the energy difference between the energy level $E_3$ and $E_2$ compared to the conventional case.

To sum up, the following can be considered the advantages of the quantum cascade laser designed according to the invention:

1. Substantial reduction of the high-energy electrons that wander into the free electric continuum which can distinctly increase the external quantum efficiency of the quantum cascade laser.
2. Providing a lattice-tension-compensation layer inside a semiconductor layer made of pot material inside the optically active area permits generating shorter wavelengths than with conventional quantum cascade lasers.
3. As the blocking layer helps effectively prevent electrons from wandering off into the free energy continuum, the transition area can be designed with a superlattice which has thicker pot structures and thus reduces the binding energy inside the deepest miniband. Provision, and designing, of the transition area as a Bragg reflector is partly or completely obviated by the invention's provision of blocking layers.

List of Reference Numbers 1 optical area
2 transition area
3 semiconductor multilayer structure
4 blocking layer
5 compensation layer

What is claimed is:

1. A laser comprising a unipolar quantum cascade laser including a plurality of adjacent semiconductor multilayer structures arranged in a periodic sequence through which an electron flow can be generated by providing at least two contact points, each of the multilayer structures having an optically active area comprising at least one quantum film structure in which there is at least one upper energy level and one lower energy level for the electrons, between the levels light emitting electron transitions occur, as well as having a transition area comprising a plurality of semiconductor layers through which electrons from the lower energy level of the optically active area pass into the upper energy level of an optically active area of an adjacent semiconductor multilayer structure, which is directly adjacent to the transition area in a direction of electron transport, wherein the electron transitions and the electron transport occur solely in the conduction band of the semiconductor multilayer structures, wherein at least one blocking layer inside the optically active area, which has an uppermost conduction band edge potential that is higher than the uppermost band edge potential of all other semiconductor layers contained inside the semiconductor multilayer structure, is provided in the semiconductor multilayer structure and acts to block electron transport at energies of an initial state of a lasing transition and above thereof and to transmit electrons at energies of a final state of the lasing transition and below thereof and is located at an end of the optically active area in the direction of electron transport directly adjacent to the transition area and solely electrons are involved in charge carrier transport.

2. The laser according to claim 1, wherein at least one further blocking layer, identically designed as said at least one blocking layer, is provided in said transition area.

3. The laser according to claim 2, wherein said at least one further blocking layer is disposed beside said at least one blocking layer separated by at least one semiconductor layer composed of a different semiconductor material.

4. The laser according to claim 1, wherein said at least one blocking layer has a layer thickness of 1 nm and less.

5. The laser according to claim 1, wherein said semiconductor multilayer structure has an alternating sequence of semiconductor layers, each of which being composed of a semiconductor material system provided with a layer combination of two different semiconductor materials, each of which is composed of a pot material and a barrier material.

6. The laser according to claim 5, wherein said semiconductor material system comprises one of a GaInAs/AlInAs layer combination or an InGaAs/AlAsSb layer combination, which are each lattice-adapted to InP as a base substrate.

7. The laser according to claim 5, wherein said semiconductor material system comprises an InAs/AlSb layer combination, which is lattice-adapted to a binary GaSb or binary InAs base substrate.

8. The laser according to claim 1, wherein said at least one blocking layer is an AlAs layer.

9. The laser according to claim 5, wherein said at least one blocking layer has a thickness and is integrated in at least one said semiconductor layer and the thickness is selected to provide a tunneling probability of electrons that is approximately the same as in said semiconductor-blocking layer at energies in the lower energy level as in said semiconductor layer without said at least one blocking layer.

10. The laser according to claim 6, wherein a AlInAs layer, AlAsSb layer or AlSb layer in a layer combination, which is adjacent to the transition area inside a semiconductor multi-layer structure, is provided in addition with an AlAs layer in the following manner: AlInAs/AlAs/AlInAs, AlAsSb/AlAs/AlAsSb or AlSb/AlAs/AlSb, with said AlAs layer always representing said at least one blocking layer.

11. The laser according to claim 10, wherein at least one further AlInAs layer, AlAsSb layer or AlSb layer in a layer combination is provided in addition with an AlAs layer in the following manner: AlInAs/AlAs/AlInAs, AlAsSb/AlAs/AlAsSb or AlSb/AlAs/AlSb, with said AlAs layer always representing said at least one blocking layer.

12. The laser according to claim 11, wherein each said AlInAs layer, AlAsSb layer or AlSb layer in a layer combination is provided in addition with an AlAs layer in the following manner: AlInAs/AlAs/AlInAs, AlAsSb/AlAs/AlAsSb or AlSb/AlAs/AlSb, with said AlAs layer always representing said at least one blocking layer.

13. The laser according to claim 12, wherein said layer combination AlInAs/AlAs/AlInAs, AlAsSb/AlAs/AlAsSb or AlSb/AlAs/AlSb has a layer thickness which is approximately the same layer thickness as said AlInAs layer, AlAsSb layer or said AlSb layer of the a semiconductor layer without said at least one blocking layer.

14. The laser according to claim 8, wherein an InAs layer is provided inside said active area.

15. The laser according to claim 14, wherein a location and thickness of said InAs layer is selected in such a manner that the lattice tension induced by said AlAs blocking layer is compensated.

16. The laser according to claim 8, wherein at least one AlAs layer as well as a InAs layer are provided inside said transition area.

17. The laser according to claim 8, wherein an InAs layer, which compensates said lattice tension induced by said AlAs blocking layer, is provided for each AlAs blocking layer inside said active area.

* * * * *

UNITED STATES PATENT AND TRADEMARK OFFICE
CERTIFICATE OF CORRECTION

PATENT NO. : 7,583,713 B2 Page 1 of 1
APPLICATION NO. : 10/488859
DATED : September 1, 2009
INVENTOR(S) : Schneider et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 414 days.

Signed and Sealed this

Fourteenth Day of September, 2010

David J. Kappos
*Director of the United States Patent and Trademark Office*